United States Patent
Ishida et al.

(10) Patent No.: US 7,167,390 B2
(45) Date of Patent: Jan. 23, 2007

(54) STORAGE DEVICE WITH RESISTIVE MEMORY CELLS ENDURING REPETITIVE DATA WRITING

(75) Inventors: Minoru Ishida, Tokyo (JP); Katsuhisa Aratani, Chiba (JP); Akira Kouchiyama, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/851,897

(22) Filed: May 21, 2004

(65) Prior Publication Data

US 2005/0097257 A1    May 5, 2005

(30) Foreign Application Priority Data

May 27, 2003    (JP)    ............................ P2003-149592

(51) Int. Cl.
G11C 11/00    (2006.01)
(52) U.S. Cl. ...................... 365/163; 365/148; 365/195; 365/189.07
(58) Field of Classification Search ................ 365/148, 365/163, 189.09, 189.07, 195, 191
See application file for complete search history.

(56) References Cited

U.S. PATENT DOCUMENTS

| | | | | |
|---|---|---|---|---|
| 6,075,719 A | * | 6/2000 | Lowrey et al. | ............. 365/148 |
| 6,673,691 B1 | * | 1/2004 | Zhuang et al. | ............... 438/382 |
| 6,747,891 B1 | * | 6/2004 | Hoffmann et al. | .......... 365/158 |
| 6,753,561 B1 | | 6/2004 | Rinerson et al. | ............. 257/295 |
| 2003/0156445 A1 | * | 8/2003 | Zhuang et al. | ............... 365/148 |
| 2003/0185036 A1 | | 10/2003 | Gilton et al. | ................ 365/100 |
| 2004/0160808 A1 | | 8/2004 | Rinerson et al. | ............. 365/158 |

FOREIGN PATENT DOCUMENTS

| | | |
|---|---|---|
| EP | 0 455 238 | 11/1991 |
| EP | 1 426 974 | 6/2004 |

OTHER PUBLICATIONS

Silver Incorporation in Ge-Se glasses used in programmable metallization cell devices, *Journal of Non-Crystallize Solids*, 299-302 (2002) 1023,2027.

* cited by examiner

*Primary Examiner*—Andrew Q. Tran
(74) *Attorney, Agent, or Firm*—Sonnenschein Nath & Rosenthal LLP

(57) ABSTRACT

A storage device comprises a memory element and an applying unit for applying a voltage to the memory element wherein the memory element changes its characteristic to record thereon information with application of a voltage to the memory element by the applying unit, the memory element further changing its characteristic when the same information is recorded on the memory element continuously. The memory element has a recording method which comprises the steps of detecting content of information that has already been recorded on the memory element when the information is recorded, comparing the information that has already been recorded on the memory element with information to be recorded on the memory element, applying a voltage to the memory element to make an ordinary information recording process if the two information are different from each other and disabling the ordinary information recording process when the two information are identical to each other. Thus, the storage device according to the present invention can satisfactorily carry out recording operations even when information is recorded continuously.

8 Claims, 8 Drawing Sheets

STORAGE DEVICE WITH RESISTIVE MEMORY CELLS ENDURING REPETITIVE DATA WRITING

RELATED APPLICATION DATA

The present application claims priority to Japanese Application(s) No(s). P2003-149592 filed May 27, 2003, which application(s) is/are incorporated herein by reference to the extent permitted by law.

BACKGROUND OF THE INVENTION

1. Field of the Invention

The present invention relates to a storage device.

2. Description of the Related Art

At present, information devices such as a computer use a large number of storage devices to record information (data) As such storage devices, a high-density DRAM (dynamic random-access memory) which can be operated at high speed is widely used (for example, see cited non-patent reference 1).

[Cited Non-Patent Reference 1]

"VLSI MEMORY" written by Ito Kioo, published by Baifuukan Publishing Company, 1994, Nov. 5, pp. 3 to 4.

The above-mentioned storage device for recording information is requested to hold recorded information by a method as simple as possible at a low voltage.

However, since the above-mentioned DRAM is a volatile memory having an extremely short information holding time and in which recorded information is lost once it is de-energized, it should be refreshed very frequently (that is, an operation for rewriting written information after the written information has been read out and again amplified). Therefore, its circuit design becomes complex and its power consumption increases unavoidably.

For this reason, a storage device of which power consumption can be reduced and which has characteristics that can replace the DRAM, for example, has been requested so far.

Since the above-mentioned DRAM is complex in manufacturing process as compared with an ordinary logic circuit LSI (large-scale-integration) and a signal processing LSI which are suitable for use with consumer electronic devices, a problem arises, in which a storage device will become costly inevitably.

As a storage device which has a possibility to realize the above-mentioned requirements, there is known a storage device having an arrangement shown in FIG. 1, for example.

FIG. 1 of the accompanying drawings is a schematic cross-sectional view showing a fundamental arrangement of a storage device, in particular, its memory element in an enlarged-scale.

As shown in FIG. 1, a memory element 20 has an arrangement in which an interelectrode material 23 is sandwiched between two electrodes (first and second electrodes 21 and 22 in the case of FIG. 1).

The storage device including the memory element 20 having such arrangement uses an ionic conductor as the interelectrode 23, for example, and further any one of the two electrodes 21, 22 (for example, the first electrode 21) contains a metal which is diffused into the ionic conductor as ions. Thus, when a voltage is applied to the two electrodes 21, 22 of the memory element 20, electric charges are supplied to the interelectrode material 23 and the metal which was contained in the first electrode 21 is diffused into the interelectrode material 23 composed of the ionic conductor as ions, whereby electric characteristics such as a resistance or a capacitance in the ionic conductor are changed to record information on the memory element 20.

Next, the manner in which such storage device is operated to record (write and erase) information in actual practice will be described more specifically.

A recording operation to change the resistance of the memory element 20 from a high level to a low level will hereinafter be defined as "writing" of information, and a recording operation to change the resistance of the memory element 20 from a low level to a high level will hereinafter be referred to as "erasing" of information.

When the storage device writes information on the memory element 20, for example, a write voltage (positive voltage) is applied to the first electrode 21 through an interconnection (not shown) connected to the first electrode 21, for example, whereby the metal contained in the first electrode 21, for example, is ionized, diffused into the ionic conductor, bonded to electrodes and thereby deposited. As a result, the resistance of the ionic conductor goes to a low level and the resistance of the memory element 20 also goes to a low level, thereby making it possible to write information in the memory element 20.

When information is erased from the memory element 20, for example, an erase voltage (negative voltage) with polarity opposite to that of the write voltage is applied to the second electrode 22 through an interconnection (not shown) connected to the second electrode 22, for example. In consequence, the metal that has been deposited in the ionic conductor is ionized again and returned to the first electrode 21, whereby the resistance of the ionic conductor goes back to the original high level and the resistance of the memory element 20 goes to a high level, thereby making it possible to erase information from the memory element 20.

FIGS. 2A, 2B and FIGS. 3A, 3B show a series of recording operations corresponding to a series of recording operations executed by the above-mentioned storage device (for example, DRAM).

FIGS. 2A, 3A show the recording operations of the DRAM, and FIGS. 3A, 3B show the recording operations of the storage device that includes the memory element 20 shown in FIG. 1.

FIGS. 2A, 2B show the manner in which information is read out from the memory element 20 after different information has been recorded repeatedly on the memory element 20, i.e. three times. FIGS. 3A, 3B show the manner in which different information are recorded on the memory element 20 and information is read out from the memory element 20 after the same information has been recorded on the memory element 20 a plurality of times, for example, five times successively.

As is clear from FIGS. 2A, 2B and FIGS. 3A, 3B, the information writing operation at the storage device including the above-mentioned memory element 20 shown in FIG. 1 (recording operation for changing the resistance value from a high level to a low level) corresponds to writing of information "1" in the case of the DRAM and information erasing operation (recording operation for changing the resistance value from a low level to a high level) corresponds to writing of information "0" in the case of the DRAM.

In the storage device including the memory element 20 shown in FIG. 1, when information is read out from the memory element 20 after information has been written in and erased from the memory element 20 alternately and successively as shown in FIG. 2B, there arises no problem.

However, when information is erased from and then read out from the memory element 20 after information has been written in the memory element 20 a plurality of times as shown in FIG. 2B, the following problem arises.

Specifically, as shown in FIG. 4, when information is repeatedly and successively written in the memory element 20, the resistance value of the memory element 20 further drops to become lower than a resistance value that has been intended to realize in the state in which information "1" should be held as the number of writing increases.

When the resistance value of the memory element 20 drops as described above, it becomes necessary to apply a large voltage to the memory element 20 to erase information from the memory element 20 next.

The memory element 20 for use with the data rewritable storage device such as the DRAM is requested to carry out recording operation in this way when information "0" and information "1" are repeatedly written in any order without limit (that is, the storage device is requested to record and read information without any limit).

This operation is such that information "0" is written on the memory element 20 after information "1" has been recorded on the memory element 20 repeatedly and continuously as shown in FIG. 3A.

Accordingly, when the storage device including the memory element 20 shown in FIG. 1 realizes a storage device which can replace the DRAM, for example, in actual practice, it becomes necessary to set a voltage applied to the memory element 20, required to erase information, to a large value on the assumption that information will be erased from the memory element 20 after information has been written repeatedly (see FIG. 3B).

However, in such case, it takes a lot of time to erase recorded information from the memory element 20, for example, and operation speed of the memory element 20 itself decreases unavoidably. In particular, when information is written in the memory element 20 after recorded information has been erased from the memory element 20 repeatedly and continuously in the manner opposite to the case assumed in FIG. 3B, the operation speed of the memory element 20 itself decreases considerably.

Having described so far the case in which the resistance value of the memory element 20 is further changed as the number of writing increases when information was written in the memory element 0 having the arrangement shown in FIG. 1 (see FIGS. 2A, 2B), it may be considered that, depending upon an arrangement of a memory element, when information is written in such memory element repeatedly and continuously, a threshold voltage of the memory element, for example, will change as the number of writing increases.

In such case, as mentioned before, it takes plenty of time to erase recorded information from the memory element, and hence operation speed of the memory element itself decreases unavoidably.

SUMMARY OF THE INVENTION

In view of the aforesaid aspect, it is an object of the present invention to provide a storage device which is able to record information satisfactorily without any limit.

According to an aspect of the present invention, there is provided a storage device comprising a memory element and an applying means for applying a voltage to the memory element wherein the memory element changes its characteristic to record thereon information with application of a voltage to the memory element by the applying means, the memory element further changing its characteristic when the same information is recorded on the memory element continuously, the storage device having a recording method which comprises the steps of detecting content of information that has already been recorded on the memory element when the information is recorded, comparing the information that has already been recorded on the memory element with information to be recorded on the memory element, applying a voltage to the memory element to make an ordinary information recording process if the two information are different from each other and disabling the ordinary information recording process when the two information are identical to each other.

According to the present invention, when information is recorded on the memory element, the content of information that has already been recorded on the memory element is detected, and the information recorded on the memory element and information to be recorded on the memory element are compared with each other. If the recorded information and the information to be recorded are different from each other, then the voltage applying means applies the voltage to the memory element to record information on the memory element by the ordinary information recording process. If the recorded information and the information to be recorded are identical to each other, then information is not recorded on the memory element by the ordinary information recording process so that, even when content of the same information, for example, is continuously recorded on the memory element, the characteristic of the memory element can be prevented from being changed further.

In the above-mentioned storage device, when the memory element has an arrangement in which an interelectrode material is sandwiched between first and second electrodes, the arrangement of the memory element can be simplified much more.

If the above-mentioned storage device has an arrangement in which content of information is detected by reading information from the memory element before information is recorded on the memory element and in which if information to be recorded and recorded information are identical to each other, then the voltage can be prevented from being applied to the memory element, then even in recording operation in which information of different content (for example, "0") is recorded on the memory element after information of the same content (for example, "1"), for example, has been recorded on the memory element repeatedly and continuously, the voltage applied to the memory element to record information of different content need not increase, and hence recording operation can be prevented from being delayed.

If the above-mentioned recording apparatus has an arrangement in which when information is recorded on the memory element, the voltage is applied to the memory element, content of information is detected by detecting change of a resistance value of the memory element and if information to be recorded and recorded information are identical to each other, then the voltage will be prevented from being applied to the memory element, since a process for reading information from the memory element is not required, content of information is detected by reading recorded information from the memory element before the aforementioned information is recorded on the memory element, and hence a time required to record information on the memory element can decrease as compared with the case in which the content of information is detected.

If the above-mentioned storage device has the arrangement in which if recorded information and information to be recorded are identical to each other, it is further determined whether or not a resistance value of the memory element falls within a range of a normalized value and if the resistance value of the memory element does not fall within the range of the normalized value, then the voltage applying means applies a voltage to the memory element to correct the above resistance value so as to fall within the range of the normalized value, even when information of different content (for example, "0") is recorded on the memory element after information of the same content (for example, "1"), for example, has been recorded on the memory element many times repeatedly and continuously and the resistance value of the memory element is changed to the outside of the normalized value, the resistance value can be corrected and an occurrence of a recording error, for example, can decrease.

If the aforementioned storage device has the arrangement in which content of information is detected by reading recorded information from the memory element before information is recorded on the memory element and if recorded information and information to be recorded are identical to each other and if a resistance value of the memory element falls within a range of a normalized value, a voltage can be prevented from being applied to the memory element, even when information of different content (for example, "0") is recorded on the memory element after information of the same content (for example, "1"), for example, has been recorded on the memory element many times repeatedly and continuously, the voltage applied to the memory element to record information of different content need not increase, and recording operation can be prevented from being delayed.

In the above-mentioned storage device, if the voltage is a pulse voltage, an amount of electric current can decrease, and a total amount of electric currents required to record information can decrease.

According to another aspect of the present invention, there is provided a storage device comprising a memory element and an applying means for applying a voltage to the memory element wherein the memory element changes its characteristic to record thereon information with application of a voltage to the memory element by the applying means, the memory element further changing its characteristic when the same information is recorded on the memory element continuously, the storage device having a recording method which comprises the step of recording information on the memory element after content of information recorded on the memory element has been erased.

According to the present invention, since information is recorded on the memory element after content of information recorded on the memory element has been erased, when information is recorded on the memory element, a time required to read information from the memory element can decrease and a recording operation can further increase in speed as compared with the case in which content of information that has already been recorded on the memory element is detected.

Further, according to the present invention, in the above-mentioned storage device, when the memory element has an arrangement in which an interelectrode material is sandwiched between first and second electrodes, the arrangement of the memory element can be simplified much more.

Furthermore, in the above-mentioned storage device, when the voltage is the pulse voltage, an amount of electric current can decrease, and a total amount of electric currents required to record information on the memory element can decrease.

DESCRIPTION OF THE PREFERRED EMBODIMENTS

The present invention will now be described below with reference to the accompanying drawings.

Prior to describing the preferred embodiments of the present invention, the fundamental arrangement of the storage device according to the present invention and its operations will be described with reference to FIG. 1.

Figure 1:
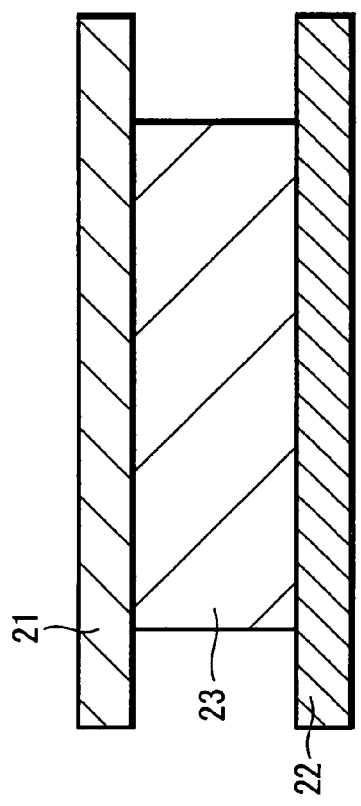
FIG. 1 is a schematic cross-sectional view showing a fundamental arrangement of a memory element for use with a storage device in an enlarged-scale.
Figure 4:
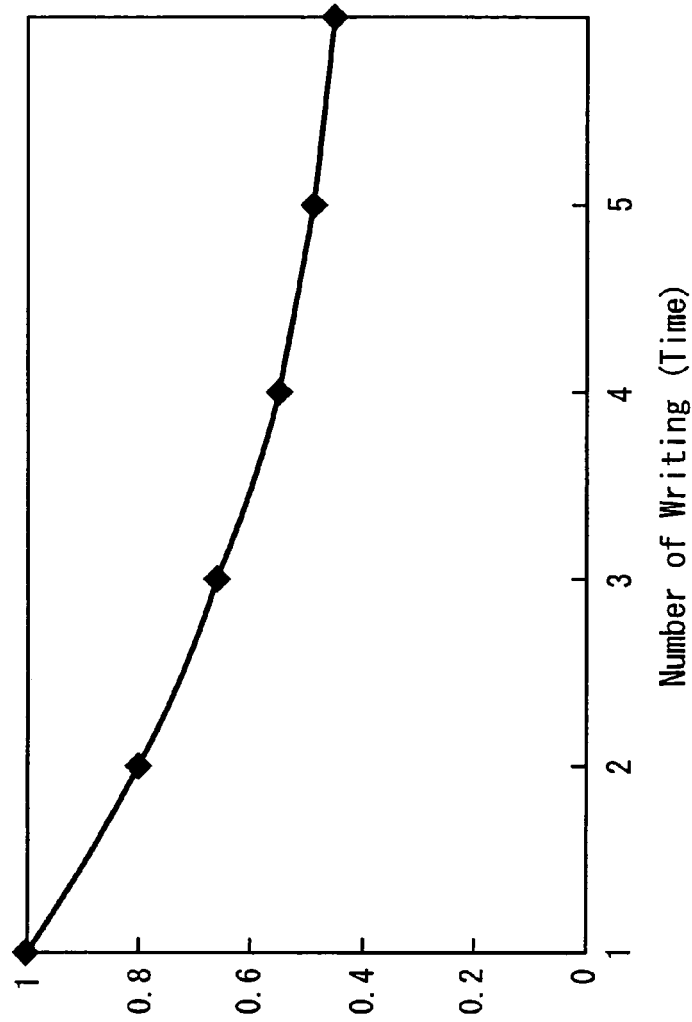
FIG. 4 is a diagram showing a relationship between the number of writing of information and a rate in which a resistance value changes.

FIG. 1 of the accompanying drawings is a schematic cross-sectional view showing a fundamental arrangement of a storage device, in particular, its memory element in an enlarged-scale.

As shown in FIG. 1, a memory element 20 has an arrangement in which an interelectrode material 23 is sandwiched between two electrodes (first and second electrodes 21 and 22 in the case of FIG. 1).

The storage device including the memory element 20 having such arrangement uses an ionic conductor as the interelectrode 23, for example, and further any one of the two electrodes 21, 22 (for example, the first electrode 21) contains a metal which is diffused in the ionic conductor as ions. Thus, when a voltage is applied to the two electrodes 21, 22 of the memory element 20, electric charges are supplied to the interelectrode material 23 and the metal which was contained in the first electrode 21 is diffused into the interelectrode material 23 composed of the ionic conductor as ions, whereby electric characteristics such as a resistance or a capacitance in the ionic conductor are changed to record information in the storage device.

According to the present invention, the storage device is composed of the memory element to record information by using the change of characteristics such as electric characteristics, and the present invention can attain the above-mentioned objects.

Subsequently, a storage device, in particular, its memory element according to an embodiment of the present invention will be described with reference to FIG. 5.

Figure 5:
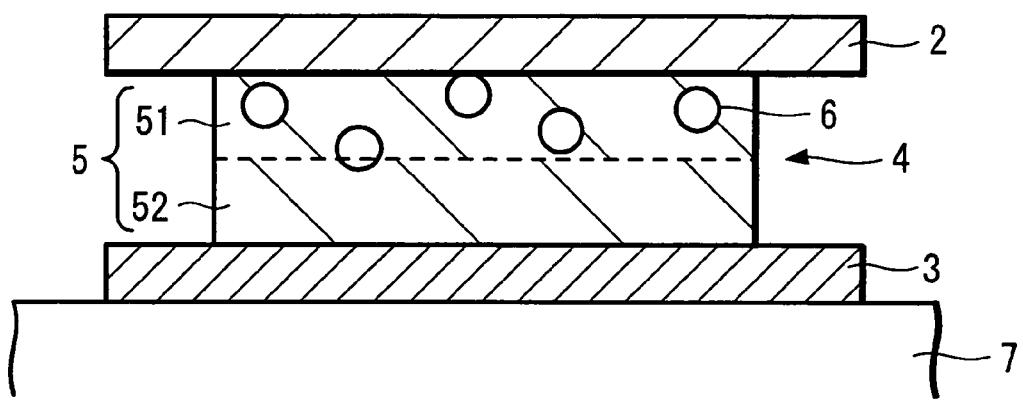
FIG. 5 is a schematic cross-sectional view showing a storage device, in particular, its memory element according to an embodiment of the present invention.

A memory element, generally depicted by the reference numeral 1 in FIG. 5, has an arrangement in which an interelectrode material 4 is sandwiched between a first electrode 2 provided on the upper side of the memory element 1 and a second electrode 3 provided on the underside of the memory element 1.

The interelectrode material 4 is composed of an ionic conductor (calcogenide ionic conductor) 5 containing a certain metal, for example.

In the case of FIG. 5, the ionic conductor 5 has an arrangement of a bilayer structure composed of an ionic conductor layer 51 provided on the side (upper side) of the first electrode 2 and an ionic conductor layer 52 provided on the side (lower side) of the second electrode 3. The ionic conductor layer 51 is made of GeSbTeAg, for example, and the ionic conductor layer 52 is made of GeSbTe, for example.

Then, the ionic conductor layer 51 has a film thickness of 25 nm, for example, and the ionic conductor layer 52 has a film thickness of 30 nm, for example.

The GeSbTeAg comprising the ionic conductor layer 51 is made such that GeSbTe containing an element belonging to calcogenide contains metal Ag.

When the ionic conductor 5 of the interelectrode material 4 is supplied with electric charges, Ag contained in the ionic conductor 5 are oxidized to produce positive ions 6 and the positive ions 6 are reduced to produce metal Ag. Thus, the ionic conductor 4 can repeatedly change its resistance between a high level state and a low level state.

As a result, the memory element 1 becomes able to record information based upon the state of the resistance of the ionic conductor 5. In the initial state, Ag is placed in the metal state, and hence the ionic conductor 5 is placed in the state of high resistance value. Then, the resistance value of the memory element 1 also changes between the high level state and the low level state similarly in unison with the state of the resistance value of the ionic conductor 5.

In order to prevent from being deteriorated, the first and second electrodes 2 and 3 are made of a substance whose valence number obtained when ionized is larger than valence number (monovalent $Ag^+$) obtained when a substance (Ag) contained in the interelectrode material 4 (that is, ionic conductor 5) is oxidized to produce the positive ions 6. More specifically, the first and second electrodes 2 and 3 are made of TiW (titanium tungsten), for example.

The valence number of Ti (titanium) obtained when it is oxidized is bivalent or trivalent or tetravalent. The valence number of W (tungsten) obtained when it is oxidized is tetravalent or pentavalent or hexavalent.

The first and second electrodes 2 and 3 are formed to have film thicknesses which are suitable for general semiconductor devices, and have film thicknesses of 100 nm, for example, respectively.

The memory element 1 having the above-mentioned arrangement is formed on the substrate 7.

Although not shown, the first and second electrodes 2 and 3 of the memory element 1 are connected with interconnections, respectively, and those interconnections are connected to suitable circuits such as a recording circuit, an erasing circuit or a reading circuit, respectively. Further, although not shown, an applying means for applying a voltage to the memory element 1 is mounted on the substrate 7 and thereby the storage device is constructed.

The above applying means for applying the voltage to the memory element 1 may be provided either on the same substrate 7 of the memory element 1 or on other portion of the same substrate 7.

Operations in which information is recorded on (written on and erased from) the above storage device in actual practice will be described more specifically.

In the following descriptions, recording operation for changing the resistance value of the memory element 1 from the high level state to the low level state will be defined as "write" of information, and recording operation for changing the resistance value of the memory element 1 from the low level state to the high level state will be defined as "erase" of information.

The above-mentioned applying means applies a voltage, for example, a pulse voltage to the memory element 1 to record information in the memory element 1.

When information is written in the memory element 1, for example, a write pulse voltage (positive voltage) is applied to the first electrode 2 through the interconnection connected to the first electrode 2, whereby Ag contained in the ionic conductor layer 51 on the side of the first electrode 2 is ionized and diffused into the ionic conductor layer 52, whereafter it is bonded to electrons on the side of the second electrode 3 of the ionic conductor layer 52 and deposited. As a result, the resistance value of the ionic conductor 5 drops and the resistance value of the memory element 1 also drops, thereby making it possible to write information in the memory element 1.

When information is erased from the memory element 1, for example, an erase pulse voltage (negative voltage) with polarity opposite to that of writing is applied to the second electrode 3 through the interconnection connected to the second electrode 3, whereby Ag deposited on the side of the second electrode 3 of the ionic conductor layer 52 is again ionized and returned to the ionic conductor layer 51 on the side of the first electrode 2. Consequently, the resistance value of the ionic conductor 5 returns to the high level state and the resistance value of the memory element 1 also rises, thereby making it possible to erase information from the memory element 1.

Figure 6:
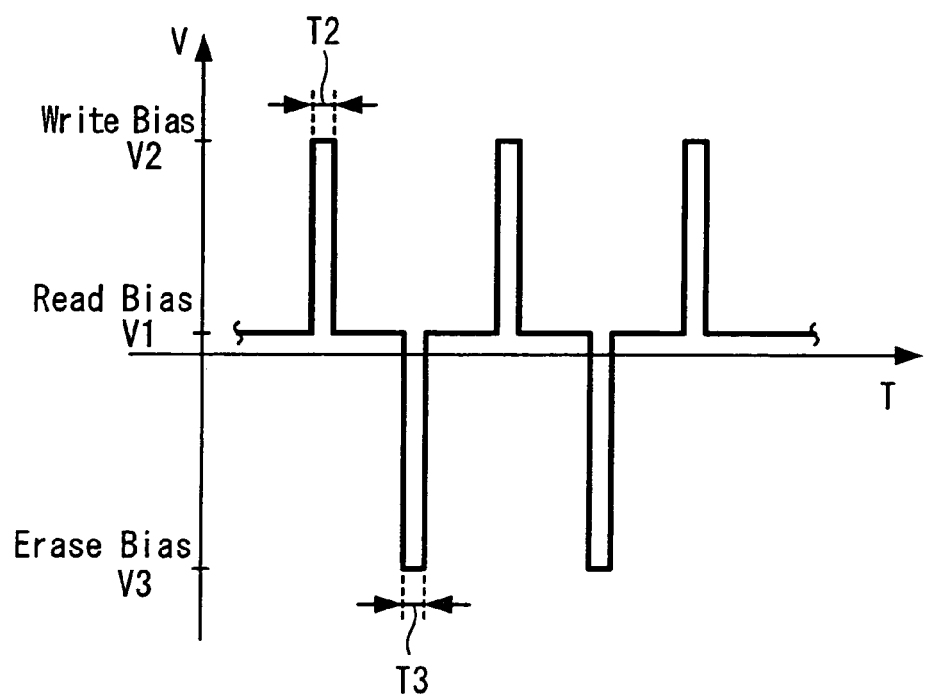
FIG. 6 is a diagram of waveforms of pulse voltages applied to the memory element shown in FIG. 5.

As pulse voltages that are applied to the memory element 1, there can be applied pulse voltages of which waveforms are illustrated in FIG. 6, for example.

In the case of the pulse voltages whose waveforms are shown in FIG. 6, a read voltage (read bias) V1 for reading the resistance value between the first and second electrodes 2 and 3 is constantly applied to the memory element 1, and further a write pulse voltage (write bias) V2 and an erase pulse voltage (erase bias) V3 are alternately and repeatedly applied to the memory element 1.

The write voltage pulse V2 is applied to the memory element 1 during a time period T2 and the erase voltage pulse V3 is applied to the memory element 1 during a time period T3, respectively.

In other words, when information is written in or erased from the memory element 1, a constant voltage is not continuously applied to the memory element 1 but the short pulse voltage (V2 or V3) is applied to the memory element 1 during only a predetermined time period (T2 or T3).

Figure 2A:
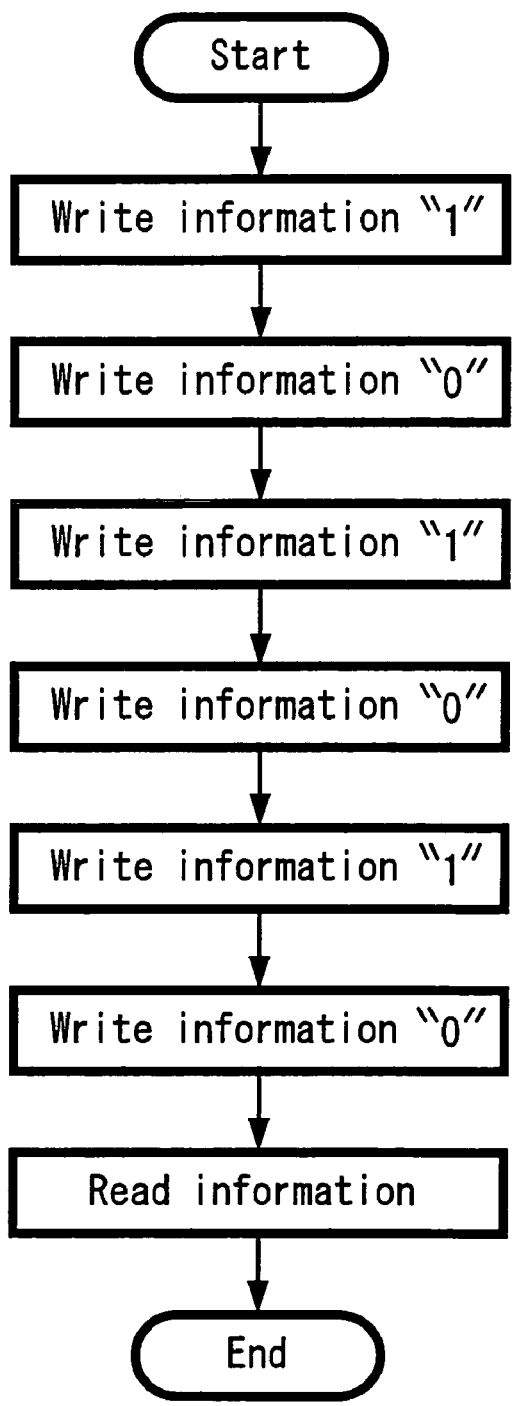
FIGS. 2A and 2B are flowcharts to which reference will be made in explaining recording operations of a DRAM (dynamic random-access memory)
Figure 2B:
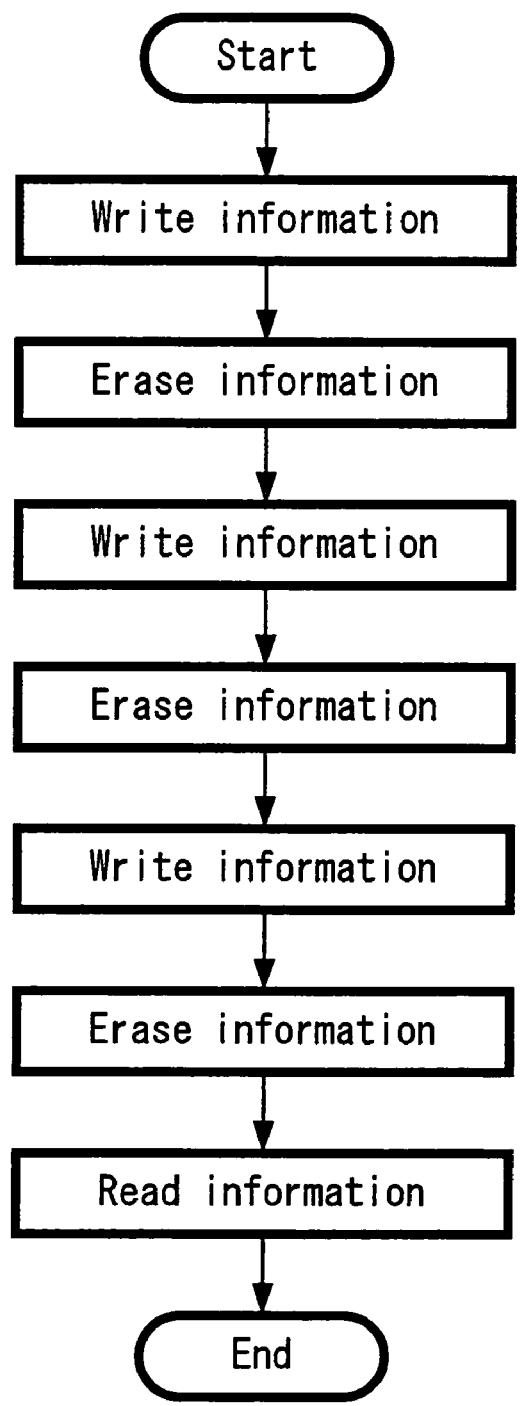
Figure 3A:
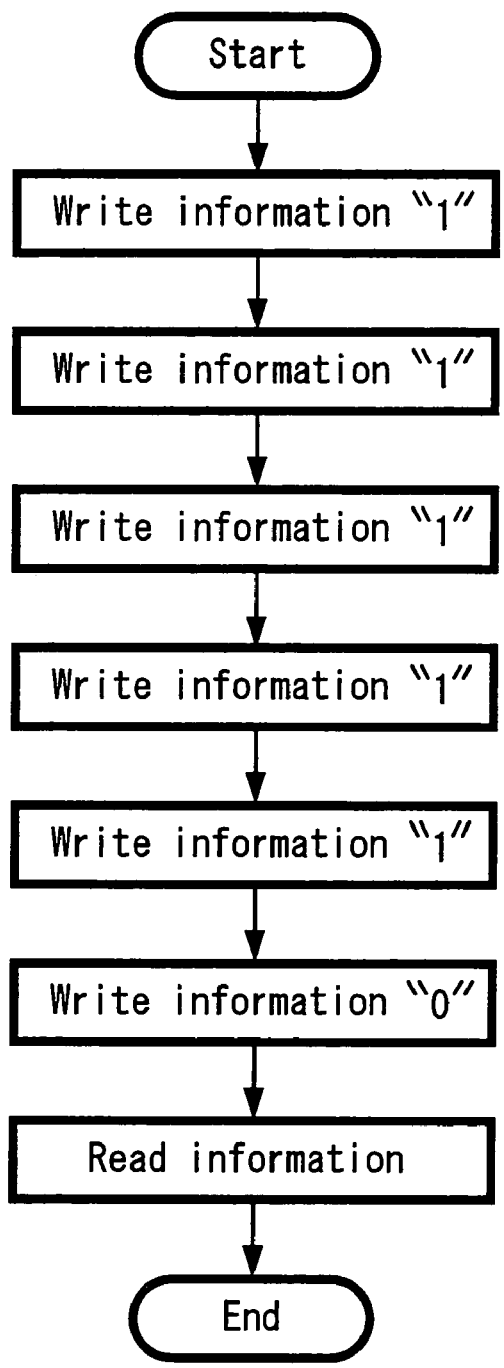
FIGS. 3A and 3B are flowcharts to which reference will be made in explaining recording operations of a storage device including a memory element.
Figure 3B:
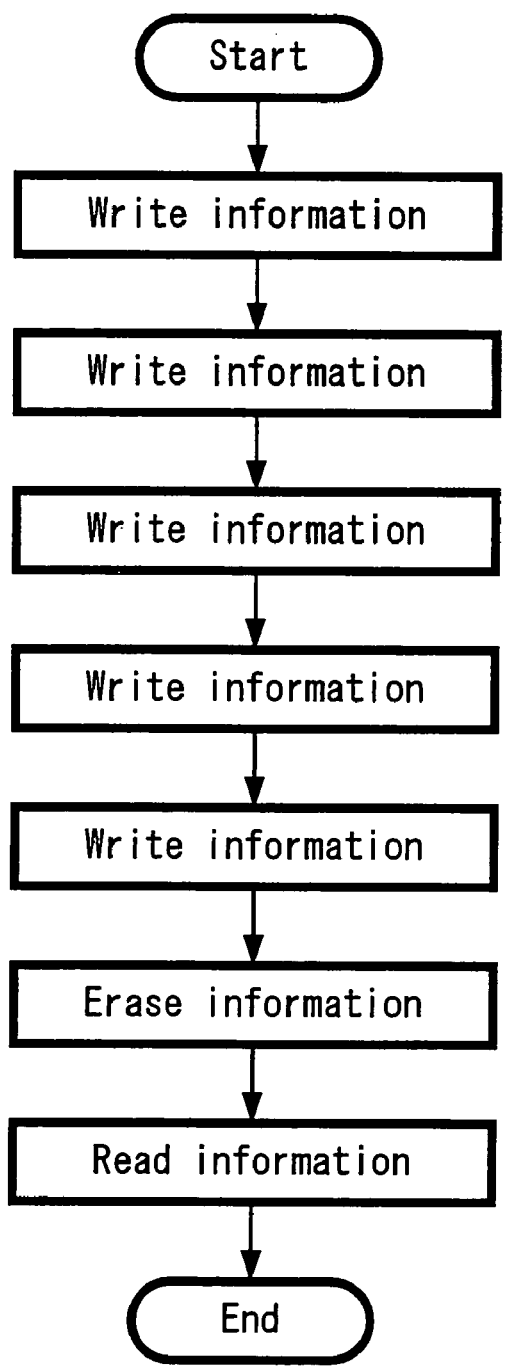

When the same information, for example, is continuously being written in the storage device including the memory element having such arrangement, as shown in FIGS. 2A and 2B, as the number of writing increases, the resistance value drops more than the resistance value obtained when information is held as it is intended (for example, resistance value of information "1").

To solve the above-mentioned problem, according to this embodiment, when information is written in the storage device, contents of information that have already been recorded on the memory element 1 are detected, and information that has been recorded on the memory element and information that is to be recorded on the memory element are compared with each other. If two of information are different from each other, then the pulse voltage is applied to the memory element 1 and the ordinary information recording process is carried out. If on the other hand two of information are identical to each other, the ordinary recording process is not carried out.

An embodiment for refraining the pulse voltage from being applied to the memory element 1 if it is determined that two information are identical to each other after information that has already been recorded was read out from the memory element 1 and contents of information were detected before information is recorded on the memory element 1 will be described below with reference to a flowchart of FIG. 7.

In this embodiment, let us define the state in which the resistance value of the memory element 1 is high as the state in which information "1" is written in the memory element 1 and also define the state in which the resistance value of the memory element 1 is low as the state in which information "0" is written in the memory element 1, respectively.

Figure 7:
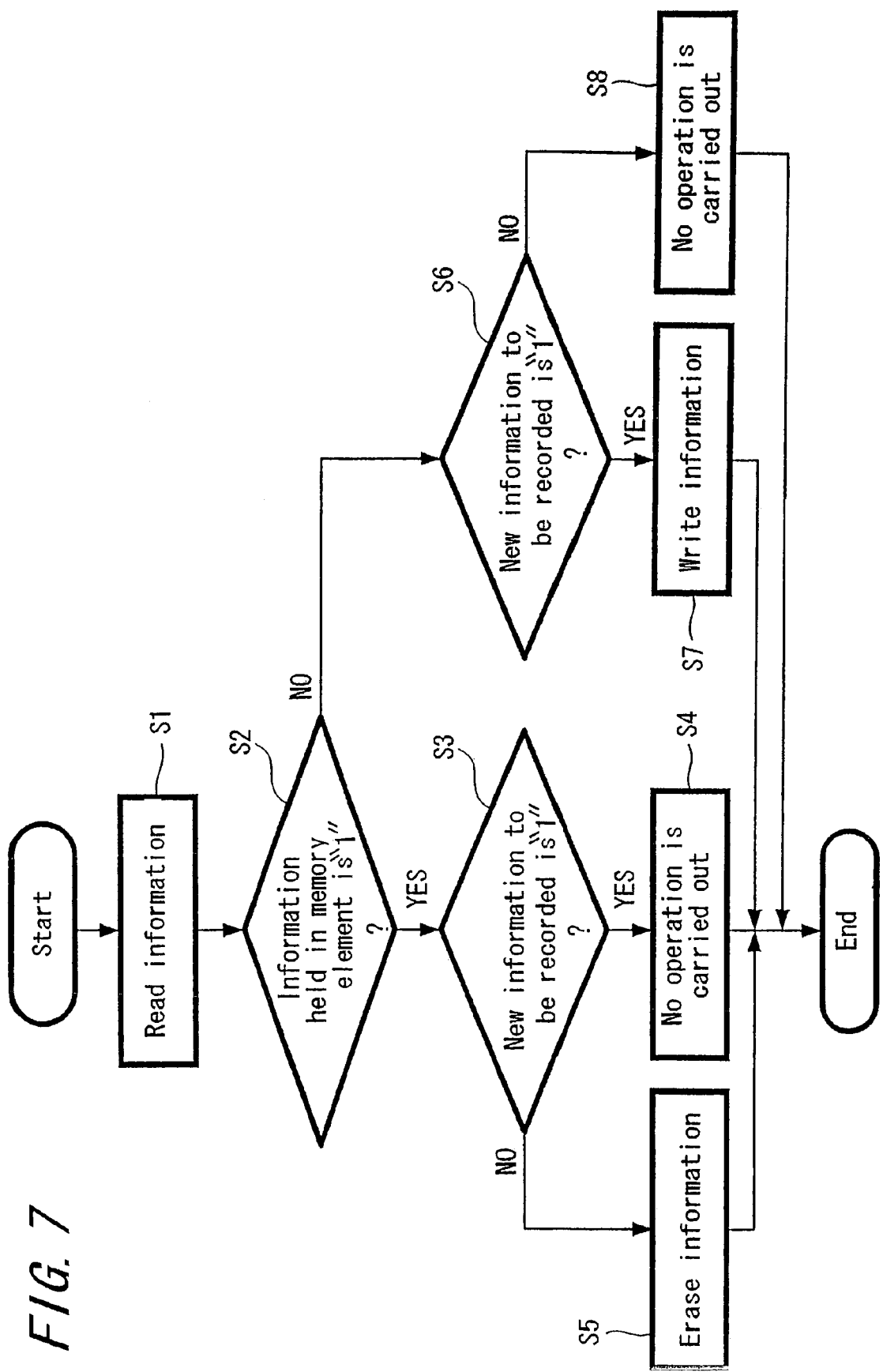
FIG. 7 is a flowchart to which reference will be made in explaining an embodiment in which content of information is detected by reading information recorded on the memory element before information is recorded and in which a voltage applying means is disabled from applying a pulse voltage to the memory element.

In the storage device according to this embodiment, referring to FIG. 7, and following the start of operation, at a step S1, information that has already been recorded is read out from the memory element 1 before information is recorded on the memory element 1. Then, control goes to the next decision step S2, whereat it is determined whether information that has already been recorded on the memory element 1 is "1" or "0". If the recorded information is "1" as represented by a YES at the decision step S2, then control goes to the next decision step S3, whereat it is determined whether or not new information that is to be recorded on the memory element 1 is "1". If new information is "1" as represented by a YES at the decision step S3, then control goes to a step S4, whereat the pulse voltage is refrained from being applied to the memory element 1 so that the information "1" is not recorded on the memory element 1, that is, the memory element 1 remains in the original state (no information is recorded on the memory element 1).

On the other hand, if the information that has already been recorded on the memory element 1 is "1" as represented by a YES at the decision step S2 and if the new information that is to be recorded on the memory element 1 is not "1" (that is, "0") as represented by a NO at the decision step S3, control goes to a step S5. At the step S5, recording of information "0" is carried out (information is erased) and the information "1" that has already been recorded on the memory element 1 is erased from the memory element 1. In other words, the ordinary recording process is carried out.

On the other hand, after information has been read out from the memory element 1, if the information that has already been recorded on the memory element 1 is not "1" but "0" as represented by a NO at the decision step S2, control goes to the next decision step S6. It is determined at the decision step S6 whether or not new information that is to be recorded on the memory element 1 is "1". If the new information is "1" as represented by a YES at the decision step S6, then control goes to a step S7, whereat recording of information "1" (information is written) is carried out as it is.

If the new information that is to be recorded on the memory element 1 is not "1" (that is, "0") as represented by a NO at the decision step S6, then control goes to a step S8, whereat recording of this information "0" (erase of information) is not carried out, and hence the memory element 1 remains in the original state (no information is recorded on the memory element 1).

In the case of FIG. 7, it is determined at the decision step S2 whether the new information that is to be recorded on the memory element 1 is "0" or "1" after information has been read out from the memory element 1 at the step S1 and after it has been determined at the decision step S2 whether or not the information that was already been recorded on the memory element 1 is "0" or "1". The present invention is not limited thereto and the following variant is also possible. That is, after information has been read out from the memory element 1 at the step S1 and after it has been determined at the decision step S2 whether new information that is to be recorded on the memory element 1 is "0" or "1", it may be determined whether or not the information that has already been recorded on the memory element 1 is "0" or "1".

Also, after it has been determined whether new information that is to be recorded on the memory element 1 is "0" or "1", information that has already been recorded may be read out from the memory element 1 similarly to the step S1. In this case, it is preferable that information should be read out from the memory element 1 only when new information that is to be recorded on the memory element 1 is "1", for example.

In addition, if it is determined that information that has already been recorded on the memory element 1 is "0" and if it is determined that new information to be recorded on the memory element 1 is "0", then recording of information "0" may be carried out or may not be carried out as shown in FIG. 7.

As described above, according to the storage device of this embodiment, since no information is recorded and the storage device remains in the original state if it is determined that the information that has already been recorded on the memory element and the new information that is to be recorded on the memory element are identical to each other after the information that has already been recorded was read out from the memory element before information is recorded on the memory element, even in the case of the recording operation in which information of different contents are to be erased from the memory element after writing of information of the same content, for example, has been repeatedly and continuously carried out, an amount of electric charges applied to the memory element 1 to erase information of different contents from the memory element 1 need not be set to a large value. Consequently, information of different contents can be erased from the memory element 1 without plenty of time, and hence speed of recording operation can be prevented from decreasing. Thus, the recording operation can be increased in speed.

Also, since the memory element 1 has the arrangement in which the interelectrode material 4 is sandwiched between the first and second electrodes 2 and 3, the arrangement of the memory element 1 can be simplified as compared with that of a memory element for use with a DRAM, for example.

In addition, since the pulse voltage is applied to the memory element 1 as the voltage, an amount of electric currents can decrease, and hence it becomes possible to decrease a total amount of electric currents required to record information on the memory element 1.

In the embodiment shown in FIG. 7, when the state in which information that has already been recorded on the memory element 1 is "1" and the state in which new information that is to be recorded on the memory element 1 also is "1" are repeatedly continued a large number of times, no processing is carried out on the memory element 1 and the memory element 1 is left as it is.

In the case of the memory element in which electric charges are applied to the memory element whose resistance value is held at high level so that the resistance value of the memory element drops, the resistance value gently changes to the initial state, that is, high resistance state as time passes. As a result, when the memory element 1 which was held at the low resistance state is left for a long time, the memory element 1 changes to the high resistance state in accordance with elapse of time, and a recording error occurs at that time.

More specifically, if the state in which the information that has already been recorded on the memory element 1 is "1" and the state in which the new information that is to be recorded on the memory element 1 also is "1" are repeatedly continued a large number of times in the embodiment shown in FIG. 7, then a recording error occurs.

Other embodiment in which the above-mentioned problem can be solved will be described with reference to a flowchart of FIG. 8.

Figure 8:
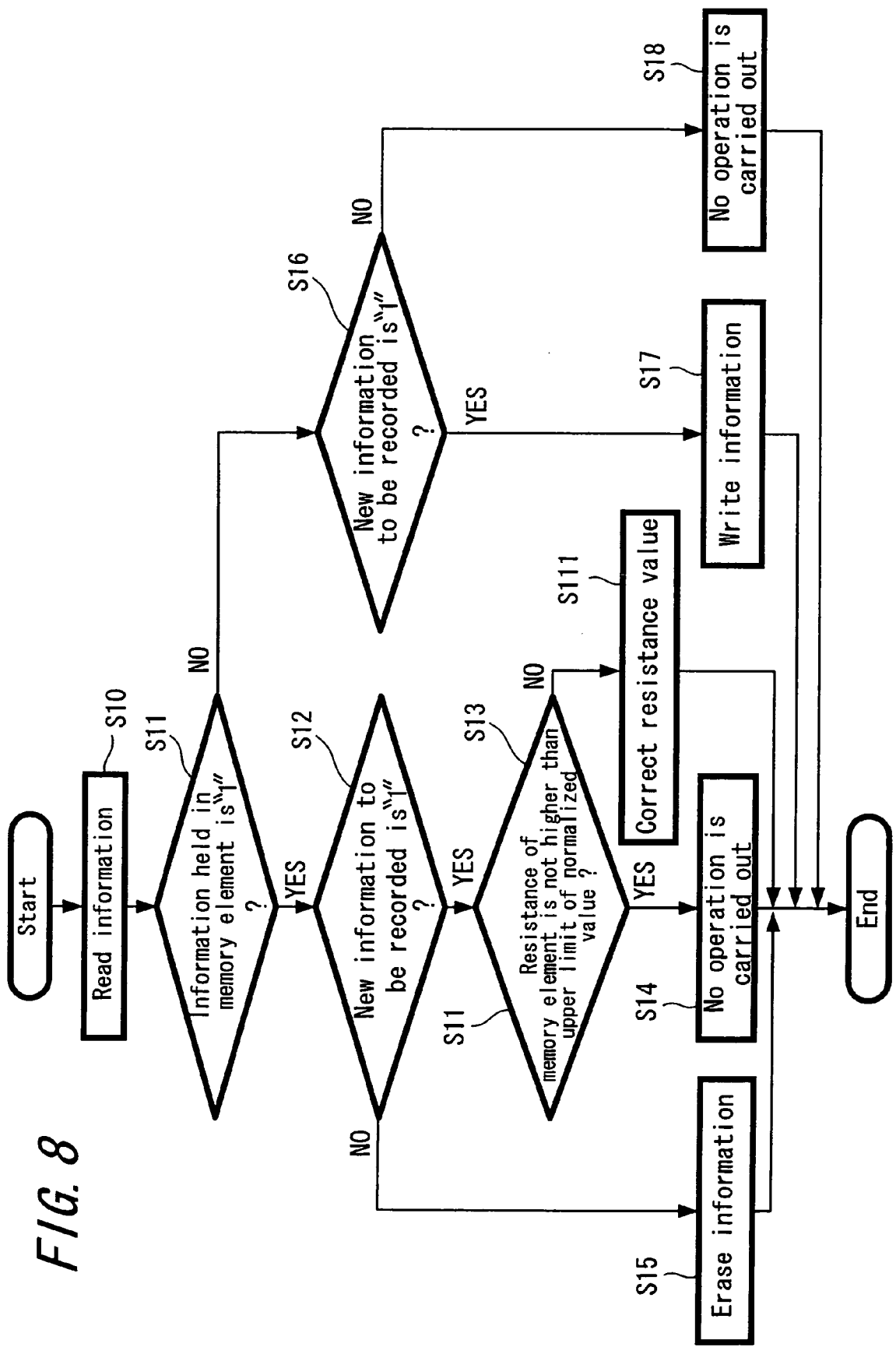
FIG. 8 is a flowchart to which reference will be made in explaining other embodiment in which a problem encountered with the above-mentioned embodiment can be solved.

In the storage device according to this embodiment, similarly to the case of the embodiment shown in FIG. 7, referring to FIG. 8, and following the start of operation, control goes to a step S10. At the step S10, information that has already been recorded is read out from the memory element 1 before information is recorded on the memory element 1. Control goes to the next decision step S11, whereat it is determined whether the information that has already been recorded on the memory element 1 is "1" or "0".

If the above information that has already been recorded on the memory element 1 is "1" as represented by a YES at the decision step S11, then control goes to the next decision step S12. It is determined at the next decision step S12 whether new information that is to be recorded on the memory element 1 is "1". If the new information is "1" as represented by a YES at the decision step S12, then control goes to the next decision step S13. At the decision step S13, it is determined whether or not the resistance value of the memory element 1 falls within a range of a normalized value. In this embodiment, it is determined at the decision step S13, whether or not the resistance value of the memory element 1 is not higher than an upper limit of the range of the normalized value.

With respect to the previously-normalized resistance value, a normalized value of a resistance value can be set in the state in which an upper limit is set to 0.1 k$\Omega$.

If the resistance value of the memory element 1 exceeds the upper limit of the range of the normalized value as represented by a NO at the decision step S13, control goes to the step S111 in this embodiment. At the step S111, the resistance value of the memory element 1 is corrected so as to fall within the range of the normalized value.

If on the other hand the resistance value of the memory element 1 falls within the range of the normalized value as represented by a YES at the decision step S13, then control goes to a step S14. At the step S14, the pulse voltage is not applied to the memory element 1, and hence the information "1" is not recorded on the memory element 1. Thus, no processing is carried out on the memory element 1 and the memory element 1 is left as it is.

After the information that has already been recorded is read out from the memory element 1 at the step S10, if the information that has already been recorded on the memory element 1 is "1" as represented by a YES at the decision step S11 and if the new information that is to be recorded on the memory element 1 is not "1" (that is, in the case of "0") as represented by a NO at the decision step S12, then control goes to a step S15. At the step S15, the pulse voltage is applied to the memory element 1, whereby information "0" is recorded (information is erased) and hence the information "1" that has already been recorded on the memory element 1 is erased from the memory element 1. In other words, the ordinary recording process is carried out.

On the other hand, after information has been read out from the memory element 1 at the step S10, if information that has already been recorded on the memory element 1 is "0" as represented by a NO at the decision step S11 and if new information that is to be recorded on the memory element 1 is "1" as represented by a YES at a decision step S16, then control goes to a step S17. At the step S17, information "1" is recorded on the memory element 1 as it is (information is written). On the other hand, if new information that is to be recorded on the memory element 1 is not "1" (that is, "0") as represented by a NO at the decision step S16, then control goes to a step S18. At the step S18, this information "0" is not recorded on the memory element 1 (information is erased from the memory element 1), and hence no processing is carried out on the memory element 1 and the memory element 1 is left as it is.

As described above, according to the storage device of this embodiment, the information that has already been recorded is read out from the memory element 1 before information is recorded on the memory element 1. If new information that is to be recorded on the memory element 1 this time and recorded information are both "1", then it is determined whether or not the resistance value of the memory element 1 exceeds the upper limit of the range of the normalized value. If it is determined that the resistance value of the memory element 1 is not higher than the upper limit of the range of the normalized value, then information is not recorded on the memory element 1 and the memory element 1 is left in the initial state. If on the other hand it is determined that the resistance value of the memory element 1 exceeds the upper limit of the range of the normalized value, then the resistance value is corrected in such a manner that the resistance value of the memory element 1 falls within the range of the normalized value. Thus, when information of different content is erased from the memory element 1 after information of the same content, for example, has been written in the memory element 1 repeatedly and continuously a large number of times, even if information is not written in the memory element 1 and the memory element 1 is left as it is so that the resistance value of the memory element 1 changes and exceeds the normalized value, the resistance value of the memory element 1 can be corrected so as to fall within the normalized value. As a result, the occurrence of recording errors can be decreased.

Also in this embodiment, since the memory element 1 has the arrangement in which the interelectrode material 4 is sandwiched between the first and second electrodes 2 and 3, similarly to the aforementioned embodiment, the arrangement of the memory element 1 can be simplified as compared with that of the memory element of the DRAM, for example.

In addition, also in this embodiment, since the pulse voltage is applied to the memory element 1 as the voltage, similarly to the aforementioned embodiment, an amount of electric currents can decrease, and hence it becomes possible to decrease a total amount of electric currents required to record information.

Subsequently, a further embodiment in which it is determined whether or not the resistance value of the memory element 1 exceeds the upper limit of the range of the normalized value and in which it is determined whether or not the resistance value of the memory element 1 is not lower than a lower limit of the range of the normalized value will be described with reference to a flowchart of FIG. 9.

Figure 9:
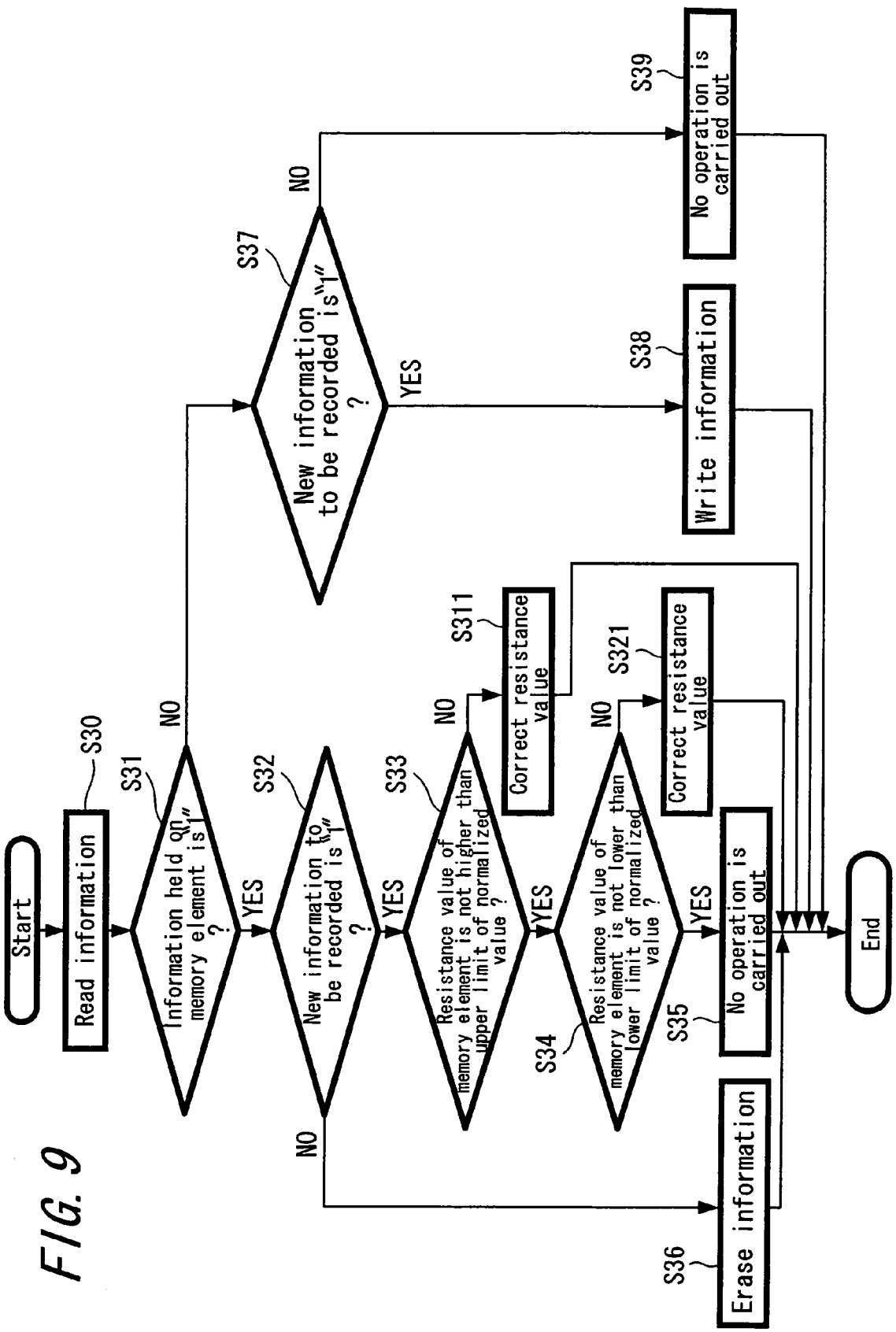
FIG. 9 is a flowchart to which reference will be made in explaining a further embodiment in which it is determined whether or not a resistance value of a memory element is higher than an upper limit of a range of a normalized value and in which it is further determined whether or not a resistance value of a memory element is lower than a lower limit of a range of a normalized value.

In the storage device according to this embodiment, similarly to the case of the embodiment shown in FIG. 8, referring to FIG. 9, and following the start of operation, control goes to a step S30. At the step S30, information that has already been recorded is read out from the memory element 1 before information is recorded on the memory element 1. Then, control goes to the next decision step S31, whereat it is determined whether the information that has already been recorded on the memory element 1 is "1".

If the information that has already been recorded on the memory element 1 is "1" as represented by a YES at the decision step S31, then control goes to the next decision step S32. In the decision step S32, it is determined whether new information that is to be recorded on the memory element 1 this time is "1". If this new information to be recorded on the memory element 1 is "1" as represented by a YES at the decision step S32, control goes to the next decision step S33. Similarly to the above-mentioned embodiment shown in the flowchart of FIG. 8, it is determined at the decision step S33 whether or not the resistance value of the memory element 1 is higher than the upper limit of the range of the normalized value.

If the resistance value of the memory element 1 is higher than the upper limit of the range of the normalized value as represented by a NO at the decision step S33, then control goes to a step S311. At the step S311, the resistance value of the memory element 1 is corrected so as to fall within the range of the normalized value.

If on the other hand the resistance value of the memory element 1 is not higher than the upper limit of the range of the normalized value as represented by a YES at the decision step S33, then control goes to the next decision step S34 according to this embodiment. It is determined at the decision step S34 whether or not the resistance value of the memory element 1 is not lower than the lower limit of the range of the normalized value.

With respect to the previously-normalized resistance values, normalized values can be set in the state in which the upper limit is set to 0.1 kΩ, the lower limit being set to 0.01 kΩ.

If the resistance value of the memory element 1 is lower than the range of the normalized value as represented by a NO at the decision step S34, then control goes to a step S321. At the step S321, the resistance value of the memory element 1 is corrected so as to fall within the range of the normalized value.

If the resistance value of the memory element 1 is not lower than the range of the normalized value as represented by a YES at the decision step S34, then control goes to a step S35. At the step S35, the pulse voltage is not applied to the memory element 1 and information "1" is not recorded on the memory element 1. Thus, the memory element 1 is left as it is (no processing is carried out on the memory element 1).

If the information that has already been recorded on the memory element 1 is "1" as represented by a YES at the decision step S31 and if the new information that is to be recorded on the memory element 1 is not "1" (that is, "0") as represented by a NO at the decision step S32, then control goes to a step S36. At the step S36, the pulse voltage is supplied to the memory element 1 as the voltage, whereby information "0" is recorded on (information is erased from the memory element 1) the memory element 1 and hence information "1" that has already been recorded on the memory element 1 is erased.

After information that has already been recorded was read out from the memory element 1 at the step S30, if the recorded information is not "1" but "0" as represented by a NO at the decision step S31 and if new information that is to be recorded on the memory element 1 this time is "1" as represented by a YES at the decision step S37, control goes to a step S38. At the step S38, information "1" is recorded (information is written in) on the memory element 1.

If on the other hand the new information that is to be recorded on the memory element 1 this time is not "1" as represented by a NO at the decision step S37, then control goes to a step S39. At the step S39, this information "0" is not recorded on the memory element 1 and the memory element 1 is left as it is (no processing is carried out on the memory element 1).

According to the storage device of this embodiment, when the information that has already been recorded on the memory element is identical to the new information that is to be written in the memory element this time, it is determined whether or not the resistance value of the memory element is not higher than the upper limit of the range of the normalized value, and further it is determined whether or not the resistance value of the memory element is not lower than the lower limit of the range of the normalized value. If it is determined that the resistance value of the memory element is not lower than the lower limit of the range of the normalized value, then no information is not recorded on the memory element and the memory element is left as it is. If it is determined that the resistance value of the memory element is lower than the lower limit of the range of the normalized value, then the resistance value of the memory element can be corrected so as to fall within the range of the normalized value. As a result, it can be determined whether the resistance value of the memory element is higher than or lower than the normalized value. Therefore, as compared with the case of the aforementioned embodiment in which it can be determined only whether the aforementioned resistance value of the memory element is higher than the upper limit of the range of the normalized value, the resistance value of the memory element can be corrected with higher accuracy, and hence the occurrence of recording errors can be decreased much more.

Further, also in this embodiment, since the memory element 1 has the arrangement in which the interelectrode material 4 is sandwiched between the first and second electrodes 2 and 3, similarly to the case of the above-mentioned embodiment, the arrangement of the memory element 1 can be simplified as compared with that of the memory element of the DRAM, for example.

In addition, also in this embodiment, since the pulse voltage is applied to the memory element 1 as the voltage, similarly to the case of the above-mentioned embodiment, an amount of electric currents can decrease, and hence it becomes possible to decrease a total amount of electric currents that is required to record information.

While the case in which the information that has already been recorded on the memory element 1 is read out from the memory element 1 before information is recorded on the memory element 1 has been so far described as the process for detecting the content of the information that has already been recorded on the memory element 1 in the embodiments shown in FIGS. 7, 8 and 9, the present invention is not limited thereto, and such a case may be considered, in which the resistance state of the memory element 1 is detected during the information recording process, for example.

In such case, in the process in which the resistance value of the memory element 1 progressively drops from the high level state of the initial state, for example, to the low level state, the resistance value of the memory element 1 should be detected before the resistance value changes to a certain value, that is, after the resistance value starts dropping in a relatively short period of time.

Then, the resistance value of the memory element 1 is detected in a short period of time after the information recording process has been started. If it is determined that information that has already been recorded on the memory element 1 and new information to be recorded on the memory element 1 this time are identical to each other, then the information recording process is stopped. In other words, the succeeding application of the pulse voltage to the memory element 1 is stopped, whereby the application of unnecessary pulse voltage to the memory element can be minimized and the resistance value of the memory element 1 can be prevented from going to excessively low or high level.

For example, when new information to be recorded on the memory element 1 this time is "1", that is, the resistance value is held at a low level, as the information recording process, the aforementioned "writing of information" is carried out by applying the pulse voltage to the memory element 1 so as to lower the resistance value.

At that time, when the resistance value detected from the memory element 1 in a short period of time after the information recording process has been started is sufficiently low, it is determined that the information that has already been recorded on the memory element 1 is "1" and is identical to new information to be recorded on the memory element 1 this time. Then, the information recording process is stopped. In other words, the succeeding application of the pulse voltage to the memory element 1 is stopped.

If on the other hand the resistance value detected from the memory element 1 in a short period of time after the information recording process has been started is yet high, then it is determined that the information that has already been recorded on the memory element 1 is "0" and is different from new information to be recorded on the memory element 1 this time. Then, the succeeding information recording process is carried out continuously, and the resistance value of the memory element 1 is completely changed from the high level state to the low level state. In other words, the ordinary recording operation (writing of information) is carried out.

If new information to be recorded on the memory element 1 this time, for example, is "0", that is, the resistance value is high, then as the information recording process, the aforementioned "erasing of information" is carried out by applying the pulse voltage to the memory element 1 so as to increase the resistance value.

At that time, if the resistance value detected from the memory element 1 in a short period of time after the information recording process has been started is sufficiently high, then it is determined that the information that has already been recorded on the memory element 1 is "0" and is identical to new information to be recorded on the memory element 1 this time. Then, the information recording process is stopped. In other words, the succeeding application of the pulse voltage to the memory element 1 is stopped.

If on the other hand the resistance value detected from the memory element 1 in a short period of time after the information recording process has been started is yet low, then it is determined that the information that has already been recorded on the memory element 1 is "1" and is different from new information to be recorded on the memory element 1 this time. Then, the succeeding information recording process is carried out, and the resistance value of the memory element 1 is completely changed from low level state to high level state. In other words, the ordinary recording operation (erasing of information) is carried out.

As described above, since the state of the resistance value of the memory element 1 is detected during the information recording process, as compared with the case in which the information that has already been recorded on the memory element 1 is read out before information is recorded on the memory element 1, the information read process, for example, is not required, and hence a time required to record information on the memory element 1 can decrease.

Next, a storage device according to yet a further embodiment of the present invention will be described below.

According to this embodiment, after the information recorded on the memory element 1 has been erased temporarily (that is, after the resistance value of the memory element 1 has been set to the initial state where the resistance value is high), information is recorded on the memory element 1.

Also in this embodiment, information is recorded on the memory element 1 by applying the voltage, for example, pulse voltage to the memory element 1.

More specifically, according to the above-mentioned embodiment, when information is recorded on the memory element, content of information that has already been recorded on the memory element is detected, and information recorded on the memory element and information to be recorded on the memory element are compared with each other. If it is determined that two of information are different from each other, then the pulse voltage is applied to the memory element 1 to carry out the ordinary information recording process. If it is determined that two information are identical to each other, then the ordinary recording process is not carried out (for example, information recorded on the memory element 1 is read out from the memory element 1 before information is recorded on the memory element 1). According to this embodiment, information is not recorded on the memory element 1 after information recorded on the memory element 1 has been read out from the memory element 1 but all information recorded on the memory element 1 are erased from the memory element 1 before information is recorded on the memory element 1.

According to the storage device of this embodiment, since information is recorded on the memory element 1 after information recorded on the memory element 1 has been temporarily erased from the memory element 1 (that is, after the resistance value of the memory element 1 has been set to the initial state where the resistance value is held at high level), regardless of a value of information recorded on the memory element 1, the pulse voltage required to erase information from the memory element 1 can be applied to the memory element 1.

Accordingly, if a time during which a pulse voltage required to erase information from the memory element 1 is applied to the memory element 1 is shorter than a time during which recorded information, for example, can be read out from the memory element 1, then as compared with the case of the above-mentioned embodiment in which information that has already been recorded on the memory element is read out from the memory element before information is recorded on the memory element, the information read process is not required, and hence the recording operation can be carried out at higher speed.

Further, also in this embodiment, since the memory element 1 has the arrangement in which the interelectrode material 4 is sandwiched between the first and second electrodes 2 and 3, similarly to the case of the above-mentioned embodiment, the arrangement of the memory element 1 can be simplified as compared with that of the memory element of the DRAM, for example.

Furthermore, also in this embodiment, since the pulse voltage is applied to the memory element 1 as the voltage, similarly to the case of the above-mentioned embodiment, an amount of electric currents can decrease, and hence it becomes possible to decrease a total amount of electric currents that is required to record information.

Figure 10A:
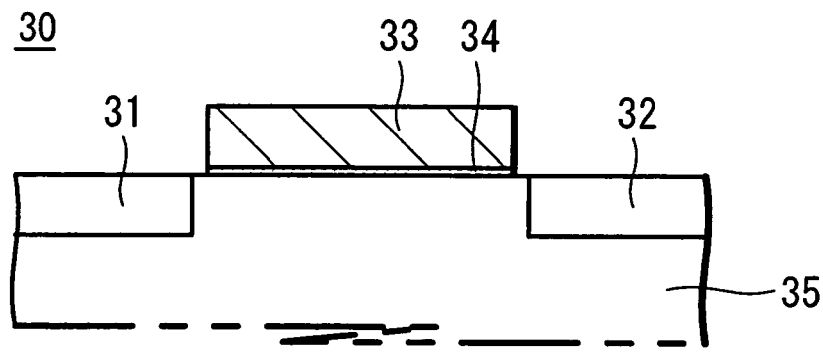
FIGS. 10A to 10C are respectively schematic cross-sectional views showing other arrangements of memory elements according to the present invention.
Figure 10B:
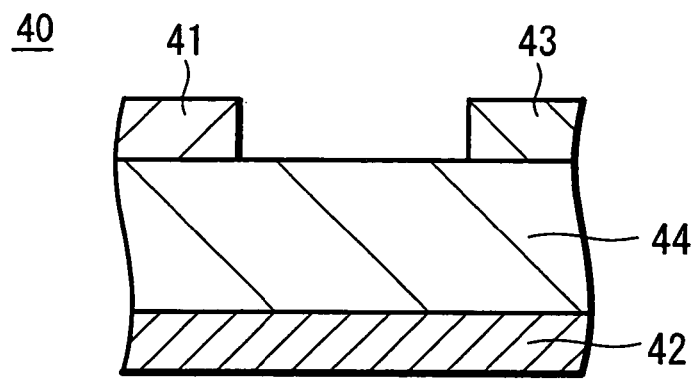
Figure 10C:
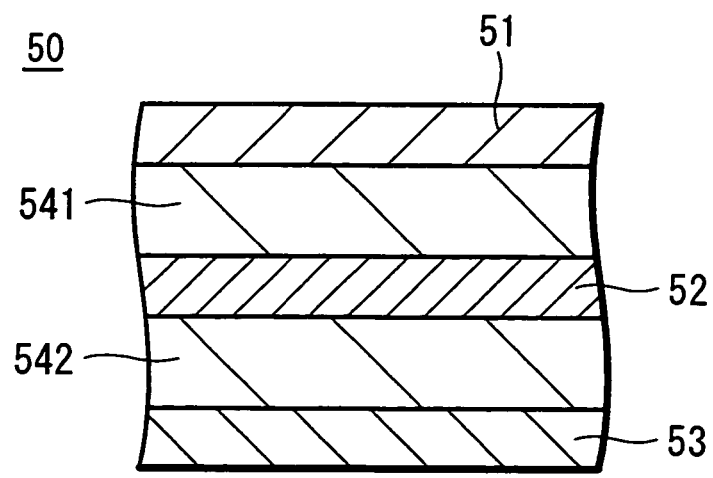

In the above-mentioned embodiments, while the storage device is configured by using the memory element 1 having the arrangement in which the interelectrode material 4 is sandwiched between the first and second electrodes 2 and 3 as shown in FIG. 5, the present invention is not limited thereto, and the storage devices according to the present invention can be configured by using memory elements having arrangements shown in FIGS. 10A to 10C.

FIGS. 10A to 10C are schematic cross-sectional views of memory elements for use with storage devices, respectively.

First, a memory element, generally depicted by the reference numeral 30 in FIG. 10A, will be described with reference to FIG. 10A. This memory element 30 is a memory element known as an MNOS (metal-nitride-oxide semiconductor) memory element having a so-called MOS (metal-oxide-semiconductor) type structure. As shown in FIG. 10A, the memory element 30 comprises a substrate 35, first and second electrodes 31 and 32 formed in the substrate 35, for example, and a third electrode 33 formed on the substrate 35 through an insulating layer 34 and so on.

In such memory element 30, when a voltage is applied to the first and third electrodes 31 and 33, electric charges are supplied to the third electrode 33 to record (write) information on the memory element 30.

Also, when a voltage is applied to the third electrode 33, for example, a threshold voltage at which an electric current starts to flow through the first and second electrodes 31 and 32 rises so that a magnitude of an electric current that flows through the first and second electrodes 31 and 32 changes to read recorded information from the memory element 30.

The memory element 30 is able to record information thereon based on changes of electric characteristics.

Next, a memory element, generally depicted by the reference numeral 40 in FIG. 10B, will be described with reference to FIG. 10B. As shown in FIG. 10B, the memory element 40 comprises an interelectrode material 44, first and third electrodes 41 and 43 provided on the predetermined positions of the upper surface of the interelectrode material 44 and a second electrode 42 provided at the predetermined position of the lower surface of the interelectrode material 44.

In such memory element 40, when a voltage is applied to the first and second electrodes 41 and 42, for example, electric charges are supplied to the interelectrode material 44, whereby a metal contained in the first electrode 41 is diffused into the interelectrode material 44 and stuck to the surface of the second electrode 42. As a result, the composition of the second electrode 42 changes to record (write) information on the memory element 40.

Also, with application of a voltage to the second and third electrodes 42 and 43, for example, a threshold voltage at which an electric current starts to flow through the second and third electrodes 42 and 43 changes or a magnitude of an electric current flowing through the second and third electrodes 42 and 43 changes to thereby read recorded information from the memory element 40. As described above, the memory element 40 is able to record information based upon changes of such electric characteristics.

Next, a memory element, generally depicted by the reference numeral 50 in FIG. 10C, will be described with reference to FIG. 10C. As shown in FIG. 10C, the memory element 50 has an arrangement in which an interelectrode material 541 is sandwiched between the first and second electrodes 51 and 52, for example, an interelectrode material 542 being sandwiched between the second and third electrodes 52 and 53.

According to such memory element 50, when a voltage is applied to the first and second electrodes 51 and 52, for example, electric charges are supplied to the interelectrode material 541 to diffuse a metal contained in the first electrode 51 into the interelectrode material 541 and thereby diffused metals are stuck to the second electrode 52. As a result, the composition of the second electrode 52 changes to record (write) information on the memory element 50.

Similarly to the case of the aforementioned memory element 40 shown in FIG. 10B, when a voltage is applied to the second and third electrodes 52 and 53, a threshold voltage at which an electric current starts to flow through the second and third electrodes 52 and 53 changes or a magnitude of an electric current flowing through the second and third electrodes 52 and 53 changes to read recorded information from the memory element 50. As described above, the memory element 50 is able to record thereon information based upon changes of electric characteristics.

According to this embodiment, the storage devices can be constructed by using the memory elements 30, 40, 50 having the above-mentioned arrangements.

While the pulse voltage has the staircase-like waveform shown in FIG. 6 in the above-mentioned embodiments, the waveform of the pulse voltage is not limited to such staircase-like waveform and may contain other suitable waveforms such as a sawtooth-like waveform and a triangular waveform.

While the operation for reading recorded information from the memory element 1 (see flowcharts of FIGS. 7, 8 and 9) and the operation for detecting the state of the resistance value from the memory element 1 have been described so far in the above-mentioned embodiments as the operation for detecting contents of information, the operations of the storage device according to the present invention are not limited to the above-mentioned operations so long as such operations are able to understand information recorded on the memory element 1.

The present invention is suitable for use with a storage device including a memory element having an arrangement in which the memory element further can change its characteristics when the same information is recorded thereon continuously.

According to the storage device of the present invention, it is possible to obtain a storage device in which recording operations can be carried out without any limitations.

Also, it is possible to obtain a storage device in which recording operations can be carried out at high speed and in which the occurrence of recording errors can decrease.

Accordingly, it is possible to provide a storage device which can be stably operated at high speed and which can be replaced with the DRAM, for example.

Further, when the memory element has the arrangement in which the interelectrode material is sandwiched between the first and second electrodes, since the arrangement of the memory element can be simplified as compared with that of the memory element of the DRAM, for example, it becomes possible to provide a storage device having an arrangement that can be manufactured inexpensively.

Furthermore, when the voltage applied to the memory element is set to the pulse voltage, since a total amount of electric currents which are required to record information on the memory element can decrease, it becomes possible to obtain a storage device of which power consumption can decrease.

Having described preferred embodiments of the invention with reference to the accompanying drawings, it is to be understood that the invention is not limited to those precise embodiments and that various changes and modifications could be effected therein by one skilled in the art without departing from the spirit or scope of the invention as defined in the appended claims.

What is claimed is:

1. A storage device comprising
   a memory element and
   an applying unit for applying a voltage to said memory element
   wherein
   said memory element changes its characteristic to record thereon new information with application of said voltage to said memory element by said applying unit,
   said memory element further changing its characteristic when the same information is recorded on said memory element continuously,
   said storage device having a recording method which comprises the steps of:
      detecting content of old information that has already been recorded on said memory element when said new information is recorded;
      comparing said old information that has already been recorded on said memory element with said new information to be recorded on said memory element;
      applying said voltage to said memory element to make an ordinary information recording process if said new and old information are different from each other; and
      disabling said ordinary information recording process when said old and new information are identical to each other,
   wherein
      said recording method further comprises the steps of further
      determining whether or not the resistance value of said memory element falls within a range of a normalized value if said two information are identical to each other and
      applying said voltage to said memory element by said applying unit to correct said resistance value so that said resistance value falls within the range of said normalized value if said resistance value does not fall within the range of said normalized value.

2. A storage device according to claim 1, wherein said memory element has an arrangement in which an interelectrode material is sandwiched between first and second electrodes.

3. A storage device according to claim 1, wherein said recording method further comprises the steps of reading old information that has already been recorded on said memory element to detect content of said old information before said new information is recorded and disabling said voltage from being applied to said memory element when said two of information are identical to each other.

4. A storage device according to claim 1, wherein said recording method further comprises the steps of applying said voltage to said memory element when said new information is recorded, detecting content of said old information by detecting a change of a resistance value of said memory element and disabling said voltage from being applied to said memory element when said two information are identical to each other.

5. A storage device according to claim 1, wherein said voltage is a pulse voltage.

6. A storage device comprising
   a memory element and
   an applying unit for applying a voltage to said memory element
   wherein
   said memory element changes its characteristic to record thereon new information with application of said voltage to said memory element by said applying unit,
   said memory element further changing its characteristic when the same information is recorded on said memory element continuously,
   said storage device having a recording method which comprises the steps of:
      detecting content of old information that has already been recorded on said memory element when said new information is recorded;
      comparing said old information that has already been recorded on said memory element with said new information to be recorded on said memory element;
      applying said voltage to said memory element to make an ordinary information recording process if said new and old information are different from each other; and
      disabling said ordinary information recording process when said old and new information are identical to each other,
   wherein said recording method further comprises the steps of applying said voltage to said memory element when said new information is recorded, detecting content of said old information by detecting a change of a resistance value of said memory element and disabling said voltage from being applied to said memory element when said two information are identical to each other,
   wherein
      said recording method further comprises steps of detecting content of said old information by reading information recorded on said storage element before said new information is recorded and disabling said voltage applying unit from applying said voltage to said memory element if said two information are identical to each other and if the resistance value of said memory element falls within a range of a normalized value.

7. A storage device according to claim 6, wherein said memory element has an arrangement in which an interelectrode material is sandwiched between first and second electrodes.

8. A storage device according to claim 6, wherein said voltage is a pulse voltage.

* * * * *